US008633706B2

(12) United States Patent
Possanzini et al.

(10) Patent No.: US 8,633,706 B2
(45) Date of Patent: Jan. 21, 2014

(54) ELECTRONIC LOAD SIMULATOR DEVICE FOR TESTING RF COILS

(75) Inventors: Cecilia Possanzini, Eindhoven (NL); Marinus Ludovicus Adrianus Vrinten, Eindhoven (NL); Marco Boutelje, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 502 days.

(21) Appl. No.: 12/997,005

(22) PCT Filed: Jun. 10, 2009

(86) PCT No.: PCT/IB2009/052458
§ 371 (c)(1),
(2), (4) Date: Dec. 9, 2010

(87) PCT Pub. No.: WO2009/153705
PCT Pub. Date: Dec. 23, 2009

(65) Prior Publication Data
US 2011/0163757 A1    Jul. 7, 2011

(30) Foreign Application Priority Data
Jun. 20, 2008  (EP) .................................... 08158695

(51) Int. Cl.
*G01R 31/06* (2006.01)
*G01R 31/02* (2006.01)

(52) U.S. Cl.
USPC ........................................ 324/546; 324/537

(58) Field of Classification Search
USPC .......................................... 324/546, 537, 500
See application file for complete search history.

(56) References Cited

U.S. PATENT DOCUMENTS

| 5,381,094 | A | * | 1/1995 | van Heelsbergen et al. .. 324/318 |
| 5,387,868 | A | * | 2/1995 | Rust et al. ..................... 324/318 |
| 7,081,752 | B2 | | 7/2006 | Skloss et al. |
| 2003/0016014 | A1 | | 1/2003 | Frederick et al. |
| 2004/0145368 | A1 | | 7/2004 | Nelson |
| 2004/0196040 | A1 | | 10/2004 | Skloss et al. |

FOREIGN PATENT DOCUMENTS

| EP | 0579300 A2 | 1/1994 |
| EP | 0590712 A1 | 4/1994 |
| WO | 2005033725 A1 | 4/2005 |
| WO | 2007124320 A2 | 11/2007 |
| WO | 2008014445 A2 | 1/2008 |

OTHER PUBLICATIONS

Yang et al: "Phantom Design Method for High-Field MRI Human Systems"; Magnetic Resonance in Medicine, 2004, vol. 52, pp. 1016-1020.
Edelstein et al: "A Signal-To-Noise Calibration Procedure for NMR Imaging Systems"; Medical Physics, Mar. 1984, vol. 11, No. 2, pp. 180-185.

* cited by examiner

*Primary Examiner* — Hoai-An D Nguyen

(57) ABSTRACT

A magnetic resonance coil testing arrangement includes an electric circuit for emulating an electrical load to a magnetic resonance coil. The electric circuit is configured to emulate an electrical load corresponding to an electrical load induced by organic tissue at the magnetic resonance frequency of the magnetic resonance coil.

12 Claims, 3 Drawing Sheets

ELECTRONIC LOAD SIMULATOR DEVICE FOR TESTING RF COILS

TECHNICAL FIELD

The invention relates to a magnetic resonance coil testing arrangement, a method of testing a magnetic resonance system and a computer program product.

BACKGROUND AND RELATED ART

Magnetic resonance imaging (MRI) is a state of the art imaging technology which allows cross-sectional viewing of objects like the human body with unprecedented tissue contrast. MRI is based on the principles of nuclear magnetic resonance (NMR), a spectroscopic technique used by scientists to obtain microscopic chemical and physical information about molecules. The basis of both NMR and MRI is the fact, that atomic nuclei with non-zero spin have a magnetic moment. In medical imaging, usually nuclei of hydrogen atoms are studied since they are present in the body in high concentrations like for example water. The nuclear spin of elementary particles can resonate at a resonance frequency, if a strong DC magnetic field is applied. This magnetic resonance (MR) frequency is determined by the magnetic field. In an MRI scanner, the magnetic field matches a selected resonance frequency only at one position in space. Only at this position the presence of these particles can be detected. By varying this position step-by-step, an image can be measured. In practice, more sophisticated algorithms are used to achieve the image in a reasonable time from e.g. 'slices' of the investigated volume. Typical resonance frequencies for protons are in the range from 42 MHz to 300 MHz, corresponding to magnetic flux levels in the range of 1 T to 7 T.

The needed strong DC magnetic field ($B_0$ field) is typically generated by superconducting magnets. In order to vary these fields, such that it matches a given radio frequency only at one position, a field gradient is generated using gradient coils. The field gradient can vary over time to achieve a scan. The frequency range in the gradient coils is low and reaches up to a maximum of 10 kHz.

To excite nuclear resonances, the RF coil generates a high frequency magnetic field at the nuclear resonance. To measure nuclear resonances, 'sensor' or 'receiver' coils are placed close to the region of interest, e.g. on the patient. These coils must be oriented such that their axis points are approximately in radial direction with respect to the axis of the MRI scanner. Often, a number of sensor coils are connected to a complete module, e.g. such a module may consist of 4×4 individual sensor coils. The module also includes additional electronics to process the measured signals.

Instead of using separate transmission and receiver coils it is also possible using combined receiver-transmitter coils. For example, only one coil arrangement can be used which can be switched between transmission and reception mode.

It is a goal of MR machine manufacturers to provide MR systems which ensure a reproducible system and high quality of MR images. High quality of MR images includes high image resolution at high image homogeneity. In order to test the performance of a magnetic resonance imaging system, typically MRI phantoms are used. A phantom is an artificial object of known size and composition that is imaged to test, adjust or monitor an MRI system's homogeneity, imaging performance and orientation aspects. A phantom may for example be a container of certain size and shape filled with a material which simulates the presence of human tissue. Phantoms can be generally further characterized with respect to human tissue similarity by their dielectric constant and electrical conductivity. In general, the electrical conductivity is directly related to the electrical load of RF coils. Further, the load upon an RF coil is directly related to a quality factor (Q) and impedance of RF coils. It has to be noted here, that coil loading is generally understood here as the interaction of any object with the RF coil which causes shifts of the resonance frequency and damping of the coil's resonance and hence reduction of the quality factor because of magnetic induction and dielectric losses in the object.

When using phantoms with a dielectric constant corresponding to the dielectric constant of tissue, the problem arises that such a high dielectric constant of tissue reduces the RF wavelength within the phantom resulting in the generation of standing waves in the phantom which greatly perturb the effective high frequency magnetic field ($B_1$) at the nuclear resonance. Due to the electrical conductivity of the tissue, the induced voltages at high frequencies yield Eddy currents large enough to attenuate the applied $B_1$ field with increasing depth in the imaged object. As a consequence, by using phantoms which have a dielectric constant similar to the dielectric constant of human tissue, the homogeneity and uniformity of an acquired MR image of the phantom at higher magnetic field strength greater than 1.5 T is degraded. At lower fields, however toxic compounds (which need a proper handling and logistic) are sometimes used in order to achieve loading properties comparable with body.

Thus, as phantom material either a material with a dielectric constant and electrical conductivity which allows avoiding dielectric resonances needs to be used for testing purposes, which however has the disadvantage that such a material is not a representative of human tissue. Or a phantom material with a dielectric constant and electrical conductivity similar to the dielectric constant of human tissue needs to be used which however strongly distorts the $B_1$ field.

In order to find a compromise between these two approaches, for example WO 2008/014445 suggests using a micelle solution to reduce dielectric resonance effects in MRI phantoms.

SUMMARY OF THE INVENTION

The present invention provides a magnetic resonance reception coil testing arrangement comprising an electric circuit for emulating an electrical load to a magnetic resonance (MR) coil, wherein the electric circuit is adapted for emulating an electrical load corresponding to an electrical load induced by organic tissue at the magnetic resonance frequency of the magnetic resonance coil. The electric circuit can be either adapted to be received within the housing of an MR coil, or the arrangement is adapted for being received in a volume circumscribed by the magnetic resonance coil.

In accordance with an embodiment of the invention, the coil testing arrangement further comprises a phantom for use with a magnetic resonance machine.

Preferably, for imaging tests phantoms with a low dielectric constant like for example oil phantoms are used, in order to avoid problems with chemical shifts as well as problems with dielectric resonances. Even though, such a phantom does not properly simulate human tissue, by the additional usage of the electrical circuit the magnetic resonance coil can nevertheless be electrically loaded in a desired manner. Preferably, phantoms with a low dielectric constant (e.g. lower that 10). are used.

Thus, by combining a phantom and an electric circuit, an electrical load can be emulated to a magnetic resonance coil, for example an MR receiving and/or transmitting coil such that it is possible to simulate large varieties of imaged object structures and conditions encountered in the usage of MR systems. It has to be noted here, that the invention is not only related to MRI systems, but also to MR systems in general, like NMR systems. Even though in NMR systems the requirement of 'high image quality' with high homogeneity is not available, the combined usage of a phantom and an electric circuit for emulating an electric load to the MR coil also allows here to test, tune and calibrate the NMR system with respect to many kinds of possible investigated substances. The invention also allows characterizing a coil without imaging in terms of signal to noise (SNR) performance. For this purpose, only the electric circuit is used for testing purposes without the phantom.

A proper load is not only important for image quality tests but also for testing the coil performance. Transmitting coils can also be loaded for testing for example the reflected power.

In accordance with the invention, the electric circuit is adapted for emulating an electric load corresponding to an electronic load induced by organic tissue at the magnetic resonance frequency of the coil. Thus, by means of the coil testing arrangement it is possible to simulate an electrical load corresponding to the load of human tissue such that an MRI system calibration is possible.

For imaging tests, image artifacts due to dielectric resonances can be avoided using phantoms with low dielectric constants, but nevertheless the similarity of the acquired response of the testing arrangement with real human tissue is high due to the additional presence of the electric circuit.

In accordance with an embodiment of the invention, the electric circuit comprises only passive electrical components in order to test RF properties for transmitting and/or receiving coils, said properties comprising signal to noise performances, reflected and transmitted power, etc.

In accordance with another embodiment of the invention, the electric circuit comprises an active electrical component, wherein the active electrical component is adapted for varying the electrical load induced to the MR coil or for limiting the interaction with the transmitting field. For example, the active electrical component may comprise transistors or pin diodes which may be used to change the electrical resistance of the electric circuit.

This allows tuning the properties of the electronic load by adjusting the bias currents of transistors used as active elements, which thus allows adapting the electrical load emulated to the receiving and/or transmitting coil. This can for example be performed by external control such that with one measurement setup in which the testing arrangement is permanently located within the MR coil during a testing procedure, various scenarios of electric loads can be emulated. It is even possible to change the electrical load during a measurement cycle thus emulating a dynamic behavior of the electrical load. This may be for example suitable in case human tissue in combination with periodically varying magnetic resonance response behavior is imaged for testing purposes like for example the human heart in order to appropriately adjust imaging pulse sequences, a gradient coil switching behavior etc.

Either, the active electrical components of the coil testing arrangement may be externally powered by means of electrical cables or by power induction means, or the coil testing arrangement may comprise a power source like for example an integrated battery. For varying the electrical load either a direct control by an external device, like for example the MRI machine itself, can be performed, or it is possible to manually adjust the electrical load induced by the electric circuit before the coil testing arrangement is placed in the volume circumscribed by the magnetic coil or positioned within the MR coil itself. Manual control may be especially suitable in case a battery powered coil testing arrangement is used in which any kind of wired connection to an external interface is avoided in order to ensure an undisturbed high quality MR system calibration. As a further alternative, wireless transmission techniques can be used to control the coil testing arrangement externally.

In accordance with a further embodiment of the invention, the active electrical component comprises a diode, wherein the active electrical component further comprises a circuit adapted for switching the diode for blocking a current flow through the diode, wherein the electric circuit further comprises an interface to the magnetic resonance machine, wherein the active electrical component is adapted for switching the diode in case the magnetic resonance machine is exciting a magnetic resonance within the volume circumscribed by the magnetic resonance coil. In this case, the emulation of the electric load to the MR coil is performed by means of a current flow through the diode.

In case of image quality tests of a receiving coil, the usage of this controlled diode has the advantage, that during RF transmission for excitation of magnetic resonances the electric load induced by the active electrical component to the receiving coil can be changed or even turned off. In other words, during transmission of an RF signal for magnetic resonance excitation the active electrical component can be made transparent to the exciting RF field. This allows avoiding $B_1$ distortions. For example, as diodes PIN diodes can be used which under zero or reverse bias have a low capacitance, such that electrical currents at the RF frequency used for excitation of the magnetic resonances are blocked. In contrast, in case the magnetic resonance machine is in data acquisition mode, wherein RF signals for example induced by free-induction decays originating from spins comprised in the phantoms are acquired, the circuit of the active electrical component switches the diode for allowing a current flow through the diode. For example, under a forward bias of 1 mA, a typical PIN diode will have an RF resistance of about 1 ohm making it a good RF conductor. In this case, during usage of the MR coil for acquiring RF images an electric load can be emulated to the MR coil by the electric circuit.

The mentioned interface is hereby required for communication of the electric circuit with the magnetic resonance machine.

In accordance with a further embodiment of the invention, the electric circuit comprises a network of active and/or passive electrical components. The usage of a network of electrical components has the advantage that in a homogeneous manner over a large spatial area an electric load can be emulated by the electric circuit to the MR coil. Preferably, the coil testing arrangement is positioned in the field of view of the MR coil wherein the electric circuit is homogeneously circumscribing this field of view parallel to the surface area defined by the MR coil itself.

In accordance with a further embodiment of the invention, the network is formed on a printed circuit board and/or a conducting sheet material on a mechanical support. In the case of a printed circuit board, the advantage is an easy manufacturability. Any kinds of electrical components can be easily assembled on such a printed circuit board. One requirement which needs to be fulfilled for all kinds of electric circuits used in the coil testing arrangement is that the electric circuit does not comprise any magnetic components since these components would further distort magnetic fields in an unwanted manner.

It has to be mentioned here, that the electric circuit may also consist of multiple printed circuit board layers. It is possible to use three-dimensional passive and/or active electrical components networks.

In accordance with a further embodiment of the invention, the electric circuit comprises fixation points for fixing the electric circuit to MR coil unit and/or the phantom. The usage of such fixation points allows to spatially position the coil testing arrangement accurately with respect to the magnetic resonance receiving and/or transmitting coil and/or patient table and/or even the MR system itself. In this context, the term MR system is understood as the mechanical structure comprising a quadrature body coil or magnet covers or the MR magnet itself. Accurate positioning especially of the electric circuit allows for further improvement of the quality of the electric load which is emulated to the MR coil. The reason is that the electric load emulated to the MR coil does not only depend on the electric circuit itself but also on the relative spatial position of the electric circuit with respect to the MR coil.

In accordance with a further embodiment of the invention, the electric circuit further comprises a radio frequency transmission coil. The usage of an additional RF transmitting probe has the advantage, that further possibilities for characterization and diagnostics of RF receiver coils can be provided. For example, by means of such a radio frequency transmission coil, an RF signal as it would be generated by a free-induction decay can be simulated such that testing of the RF receiver coil can be performed without using any previous RF transmission for spin excitation purposes. In this way the electronic load would emulate not only the conductivity of human tissue but also its response to an MR excitation, enabling testing receiving RF coils for instance without using an external transmitting coil.

In another aspect, the invention relates to a method of testing a magnetic resonance system, the system comprising a magnetic resonance coil, the method comprising providing a magnetic resonance coil testing arrangement comprising an electric circuit, the electric circuit being adapted for emulating an electrical load corresponding to an electrical load induced by organic tissue at the magnetic resonance frequency of the magnetic resonance coil to the MR coil. The method further comprises testing the magnetic resonance system, wherein the magnetic resonance coil is loaded with the coil testing arrangement.

In accordance with an embodiment of the invention, the coil testing arrangement further comprises a phantom for use with a magnetic resonance machine.

In accordance with an embodiment of the invention, the testing coil arrangement is positioned in the field of view of the MR coil.

In accordance with a further embodiment of the invention, the electric circuit comprises an active electrical component, wherein the method further comprises varying by the active electrical component the electrical load induced to the MR coil.

In accordance with a further embodiment of the invention, the electric circuit further comprises mechanical fixation points, wherein positioning the coil testing arrangement further comprises fixing the electric circuit to the phantom and/or the MR coil and/or the patient table.

In accordance with a further embodiment of the invention, the electric circuit further comprises a radio frequency transmission coil, wherein the method further comprises transmitting by the radio frequency transmission coil a radio frequency signal to the MR coil.

In another aspect, the invention relates to a computer program product comprising computer executable instructions to perform the method according to the invention.

BRIEF DESCRIPTION OF THE DRAWINGS

In the following preferred embodiments of the invention are described in greater detail by way of example only making reference to the drawings in which.

DETAILED DESCRIPTION

Figure 1:
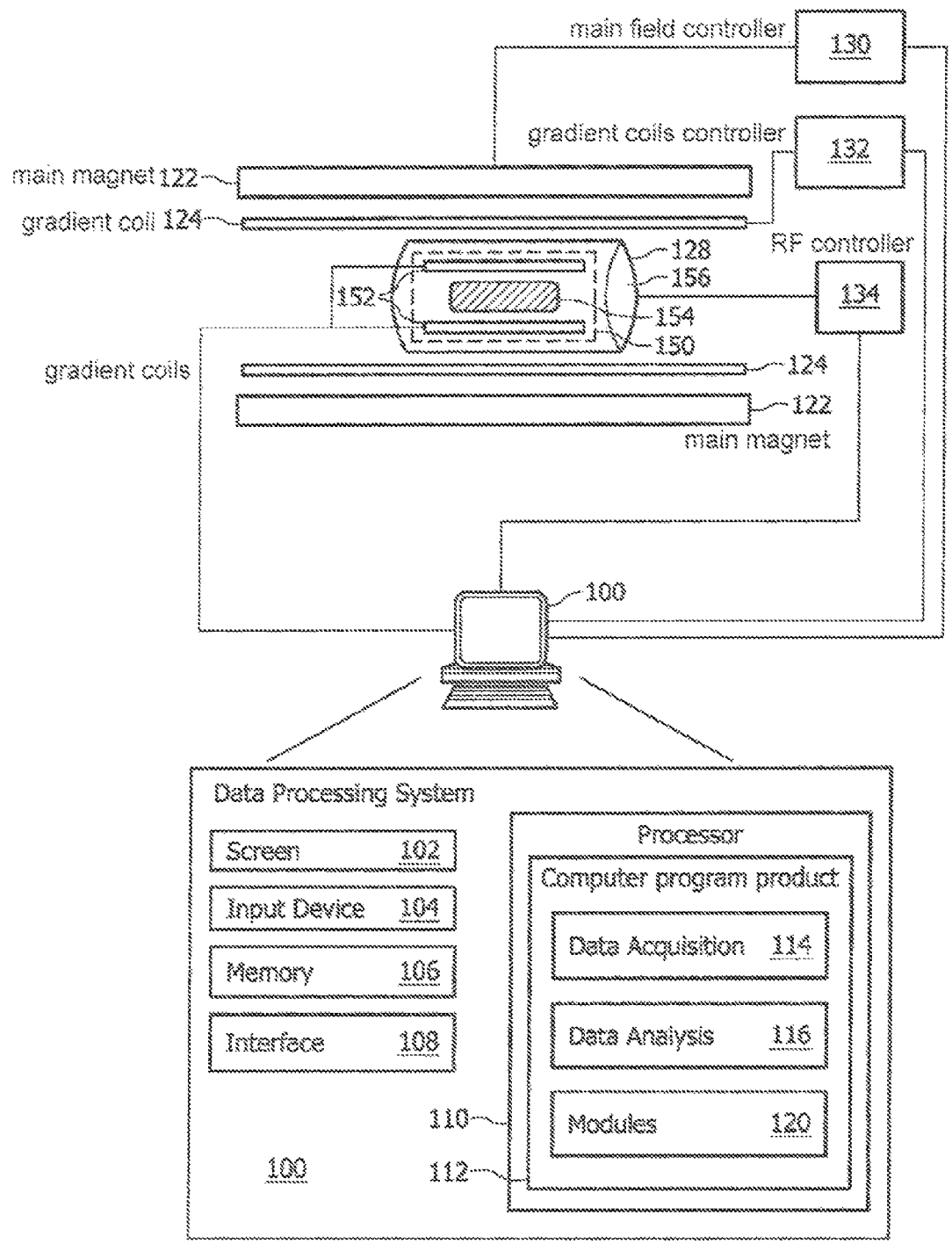
FIG. 1 is a schematic illustrating an MRI system according to the invention.

In the following, similar elements are depicted by the same reference numerals.

FIG. 1 is a schematic illustrating an MRI system according to the invention. Only major components over a preferred MRI system which incorporate the present invention are shown in FIG. 1. The magnetic resonance imaging apparatus comprises a data processing system 100, wherein the data processing system 100 typically comprises a computer screen 102 and an input device 104. Such an input device could be for example a keyboard or a mouse. The MRI system further comprises a memory 106 and an interface 108. The interface is adapted for communication and data exchange with typical hardware MRI components.

Typical hardware MRI components are for example a main field control unit 130 adapted for controlling the main field of the magnet 122. The interface 108 is also adapted to communicate with the gradient coil unit 132, wherein respective gradient coils 124 are preferably self-shielded gradient coils for producing gradients along three mutual axis x, y and z. The MRI system further comprises an RF coil 128 electrically connected to an RF coil unit 134. In the present embodiment, the RF coil is a combined transmitter-receiver coil. Therefore, the RF coil 128 is adapted for transmission of an RF pulse.

By means of an RF generator, an RF pulse sequence is generated under control of the data processing system 100 and for example protons 1 H in the phantom 154 located in the field of view of the coil 128 are excited in a predefined manner. The resulting magnetic resonance imaging signal is then detected by the RF coil 128. This is followed by a processing of the acquired RF signal for example by means of the data processing system 100. For this purpose, the data processing system 100 comprises a processor 110 which is able to execute computer program product 112 comprising computer executable instructions. Such instructions may for example comprise a data acquisition module 114 used for performing an imaging procedure of the phantom 154. The data analysis module 116 is adapted for performing data analysis of the acquired image data.

Further shown in FIG. 1 is an electric circuit 152 which in combination with the phantom 154 forms the magnetic resonance coil testing arrangement. In the present embodiment of FIG. 1, the electric circuit is electrically connected to the interface 108 of the data processing system 100. The purpose of this electrical connection is that by means of the module 120 the data processing system 100 is able to control the behavior of emulation of an electric load by the electric circuit to the coil 128. For example, an operator of the data processing system may provide the electric circuit the actual MR resonance frequency at which the MR system is operated. Thus, the electric circuit 152 will change its electrical properties to adapt for this certain MR resonance frequency. Further, as already mentioned above in case the electric circuit comprises a combination of active and passive components, by means of for example diodes the data processing system 100 may switch the electric load of the electric circuit to 'transparency' during an excitation of the spin system of the phantom 154 and to 'emulation of organic tissue' during a subsequent MR data acquisition which includes receiving of RF signals by means of the coil 128 from the phantom 154.

Figure 2:
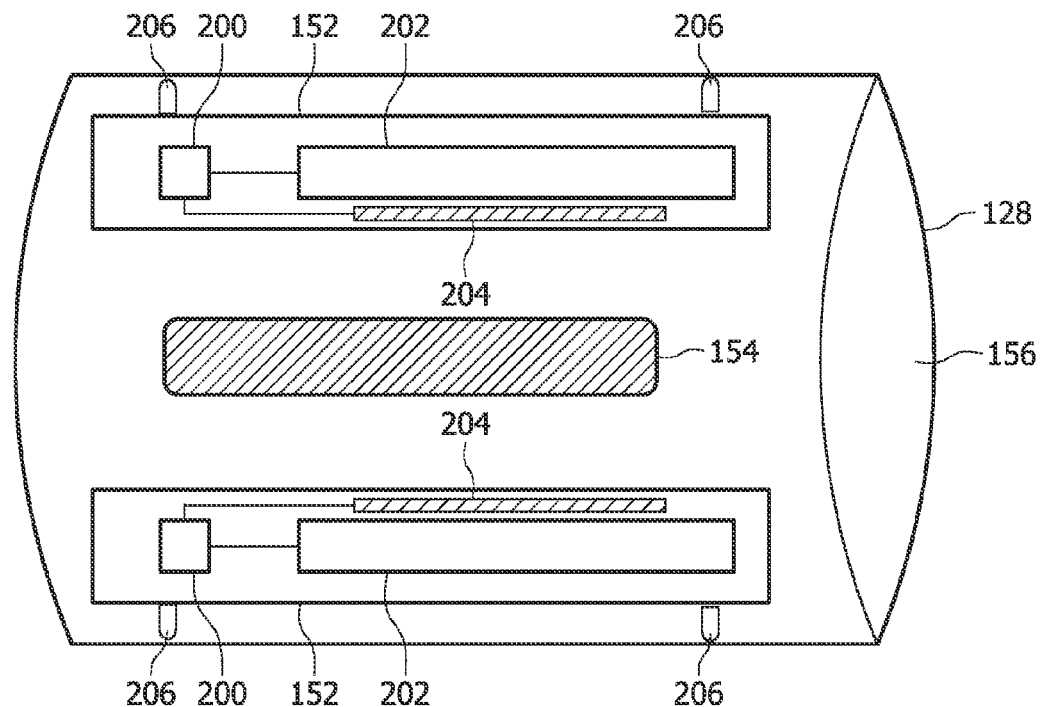
FIG. 2 illustrates a magnetic resonance reception coil testing arrangement positioned in a magnetic resonance reception coil.

FIG. 2 is a schematic illustrating a magnetic resonance coil testing arrangement according to the invention. Further shown in FIG. 2 is the MR reception coil 128, wherein the coil testing arrangement is comprised in the volume 156 circumscribed by the magnetic resonance reception coil 128. The MR reception coil testing arrangement consists of the phantom 154 circumscribed by the electric circuit 152. The electric circuit 152 is fixed to the MR reception coil 128 by fixation means 206. However, it is also possible to fix the electric circuit to the patient table and/or MR system.

The electric circuit 152 comprises an active component 200, which may for example comprise transistors, integrated circuits etc. The electric circuit further comprises a further electrical component which is controlled by the active electrical component 200. For example, by means of the active electrical component 200 the electrical resistance of the electrical components 202 may be changed or adapted for properly adapting the emulation behavior of an electrical load to the reception coil 128. The advantage of using the active elements 200 is that the resistance of the electrical components 202 may be tuned with the field strength $B_0$ of the main magnetic field by adjusting for example the bias current to transistors used for setting the resistance of the electrical elements comprised in the electric component 202.

Further shown in FIG. 2 are additional RF transmission coils 204. These RF transmission coils can be used for transmitting an RF signal to the coil 128 thus allowing simulating the presence of any arbitrary MR signal. This allows testing the RF reception capabilities of the MR coil 128 and also the receiver chains of the MR system.

Figure 3:
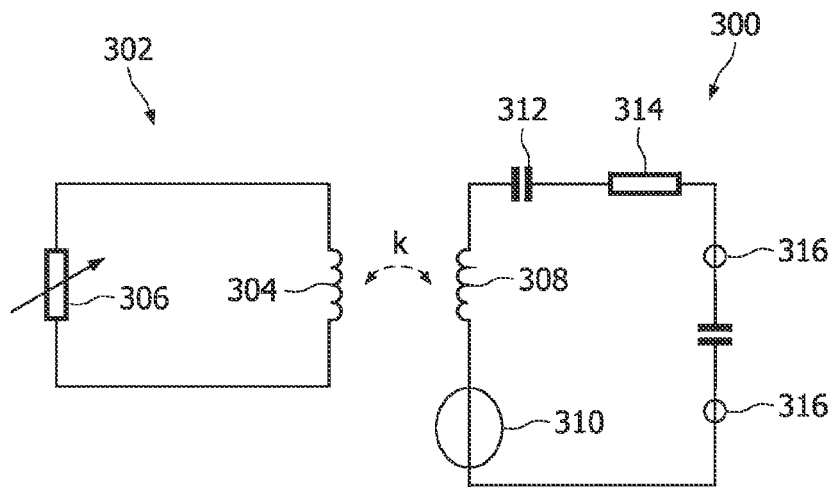
FIG. 3 is a block diagram illustrating the interaction between a magnetic resonance reception coil and a magnetic resonance coil testing arrangement.

FIG. 3 is a block diagram illustrating the interaction between a coil testing arrangement and a magnetic resonance receiving and/or transmitting coil. Here, the MR coil electric circuit is denoted by the reference numeral 302 and comprises an inductivity 304. This inductivity 304 couples 'k' with an inductivity 308 of the MR coil. Thus, the inductivity 304 acts as a load to the MR coil 300.

The electric circuit 302 further comprises a tunable resistor 306 which by changing its resistance allows to change the coupling 'k' of the electric circuit 302 to the MR and therefore the simulated load of the coil 300.

The MR coil 300 is further characterized by a capacity 312 and a resistor 314 which in combination with the inductivity 308 provide the resonance circuit of the MR coil 300.

In order to test the effect of the coil testing arrangement comprising the electric circuit 302, frequency dependent simulations have been performed which are illustrated in FIG. 4.

Figure 4A:
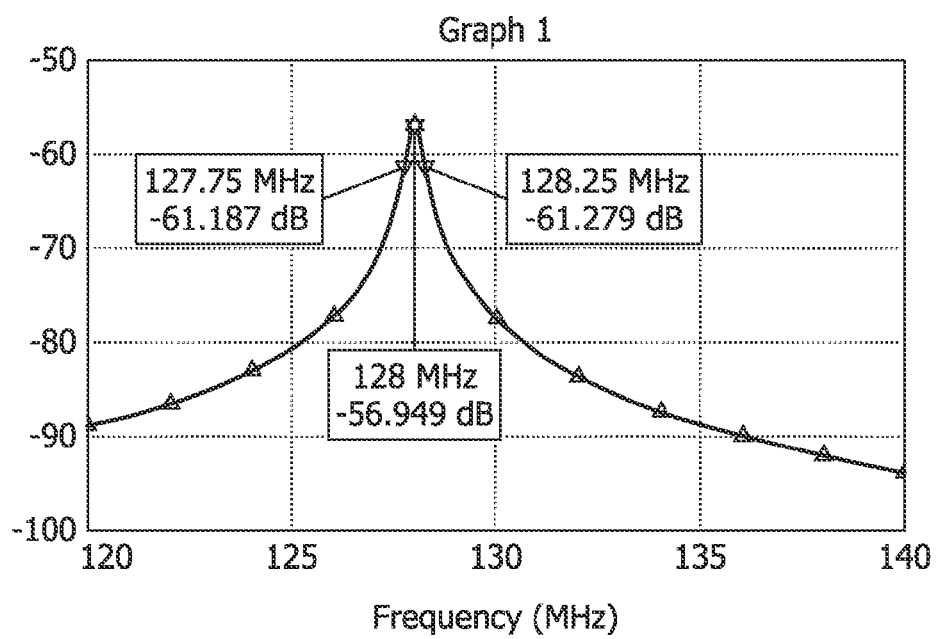
FIG. 4 illustrates a simulation of the effect of an electric circuit of a reception coil testing arrangement on the electronic load of a magnetic resonance reception coil.
Figure 4B:
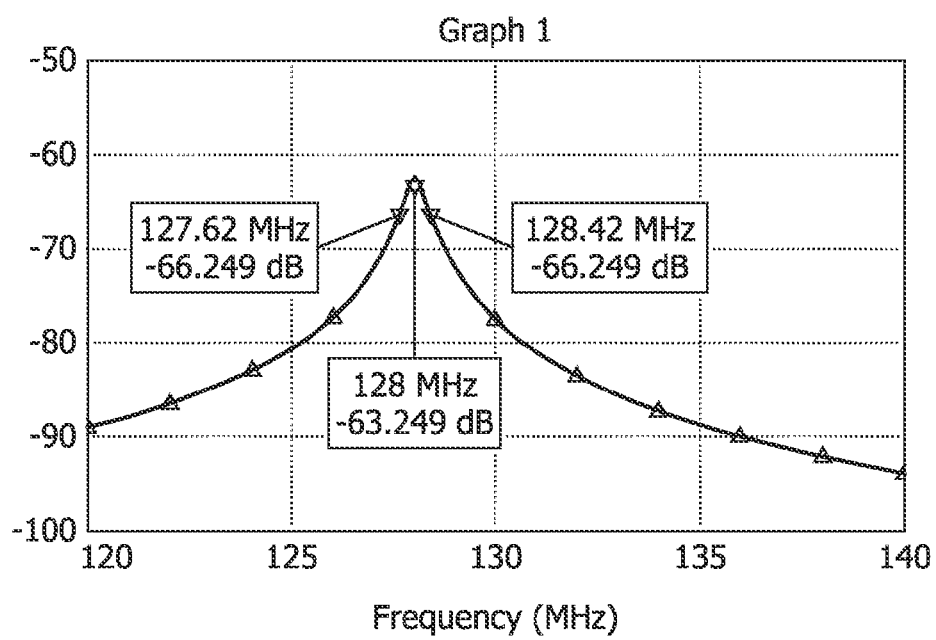

The abscissa of the diagrams FIGS. 4a and 4b, show the RF frequency in MHz at which the simulation was performed, whereas the ordinates of FIGS. 4a and 4b illustrate a logarithmic scale of the voltage measured at points 316 in FIG. 3 divided by the voltage induced at point 310. Thus, the graphs in FIGS. 4a and 4b illustrate the electronic load at the RF receiver coil 300.

In FIG. 4a, the simulation was performed with an unloaded RF coil 300. In other words, the simulation was performed with absence of the electric circuit 302. This corresponds in FIG. 3 to a virtual resistance of the resistor 306 of R=∞. The curve in FIG. 4a corresponds to a quality factor (Q factor) of around Q=320. By 'loading' the coil 300 setting the resistance of the resistor 306 to R=300Ω, the measured electric load changes remarkably, as can be seen from FIG. 4b. The resulting quality factor Q in FIG. 4b drops to Q=160 which indicates the presence of much higher losses. This is due to the high electric load due induced by the electric circuit 302 located in close vicinity of the coil 300. Thus, by means of a coil testing arrangement comprising besides a phantom additionally an electric circuit for emulating an electric load to a coil, it is possible to emulate for example the presence of human tissue with respect to induced losses in the RF coil electric circuit.

Another advantage of this method is to have a coil testing arrangement as 'universal' phantom applicable for MR system tests independent on used magnetic field strength and types of RF coils.

REFERENCE NUMERALS 100 data processing system
102 screen
104 input device
106 memory
108 interface
110 processor
112 computer program product
114 module
116 module
120 module
122 main magnets
124 gradient coils
128 RF coil
130 main field control unit
132 gradient coils control unit
134 RF control unit
150 MR reception coil testing arrangement
152 electric circuit
154 phantom
156 volume
200 active electrical component
202 electrical component
204 RF transmission coil
206 fixation means
300 RF coil
302 electric circuit
306 resistor
308 impedance
310 point
312 capacitor
314 resistor
316 points

The invention claimed is:

1. A magnetic resonance (MR) coil testing arrangement in a volume circumscribed by a magnetic resonance reception coil, the arrangement comprising an electric circuit for providing an electrical load to the magnetic resonance coil, the electric circuit including a phantom, a first electrical component, and a second electrical component, the second electrical component having a tunable resistance that is changed by the first electrical component to emulate the electrical load to be equivalent to an electrical load induced by organic tissue at a magnetic resonance frequency of the magnetic resonance coil.

2. The arrangement of claim 1, wherein the electric circuit further comprises a radio frequency (RF) transmission coil for transmitting an RF signal to the magnetic resonance reception coil.

3. The arrangement as claimed in claim 1, wherein the arrangement is comprised in a magnetic resonance coil.

4. The arrangement of claim 1, wherein the electric circuit comprises only passive electrical components.

5. The arrangement of claim 1, wherein the first electrical component comprises an active electrical component configured to vary the electrical load induced to the magnetic resonance coil.

6. The arrangement of claim 5, wherein the active electrical component comprises a diode and a switching circuit configured to switch the diode for blocking a current flow through the diode when a magnetic resonance within the volume circumscribed by the magnetic resonance coil is excited.

7. The arrangement of claim 1, wherein the electric circuit is affixed to one of the magnetic resonance coil, the phantom, and a patient table of an MR system.

8. A method of testing a magnetic resonance (MR) system having a volume circumscribed by a magnetic resonance reception coil, the method comprising acts of:
providing in the volume an electric circuit for providing an electrical load to the magnetic resonance reception coil, the electric circuit including a phantom, a first electrical component, and a second electrical component, the second electrical component having a tunable resistance; and
testing the magnetic resonance system by the first electrical component changing the tunable resistance to emulate the electrical load to be equivalent to an electrical load induced by organic tissue at the magnetic resonance frequency of the magnetic resonance coil.

9. The method of claim 8, wherein the electrical component comprises an active electrical component, the method further comprising an act of using the active electrical component to vary the electrical load induced to the magnetic resonance coil.

10. The method of claim 8, wherein the electric circuit is affixed to one of the phantom, the magnetic resonance coil, and a patient table of the MR system.

11. The method of claim 8, wherein the electric circuit further comprises a radio frequency transmission coil, the method further comprising an act of transmitting by the radio frequency transmission coil a radio frequency signal to the magnetic resonance coil.

12. A non-transitory computer readable medium comprising computer instructions which, when executed by a processor, perform a method of testing a magnetic resonance system having a volume circumscribed by a magnetic resonance reception coil using, the system comprising a magnetic resonance coil, the method comprising acts of:
providing in the volume an electric circuit for providing an electrical load to the magnetic resonance reception coil, the electric circuit including a phantom, and a first and second electrical components, the second electrical component having a tunable resistance; and
testing the magnetic resonance system by first electrical component changing the tunable resistance to emulate the electrical load to be equivalent to an electrical load induced by organic tissue at the magnetic resonance frequency of the magnetic resonance coil.

\* \* \* \* \*